US007222320B2

(12) United States Patent  (10) Patent No.: US 7,222,320 B2
Ogawa  (45) Date of Patent: May 22, 2007

(54) LAYOUT METHOD OF DECOUPLING CAPACITORS

(75) Inventor: Yasushige Ogawa, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 21 days.

(21) Appl. No.: 11/023,829

(22) Filed: Dec. 29, 2004

(65) Prior Publication Data

US 2006/0017135 A1    Jan. 26, 2006

(30) Foreign Application Priority Data

Jul. 22, 2004   (JP)   ............................. 2004-214759

(51) Int. Cl.
   *G06F 17/50*   (2006.01)
(52) U.S. Cl. ................. 716/11; 716/5; 716/10
(58) Field of Classification Search ............ 716/10, 716/5, 11
   See application file for complete search history.

(56) References Cited

U.S. PATENT DOCUMENTS

| 5,322,438 | A  | * | 6/1994  | McNutt et al. ................. 716/8  |
| 6,061,508 | A  | * | 5/2000  | Mehrotra et al. ............... 716/6  |
| 6,487,702 | B2 | * | 11/2002 | Lin et al. ....................... 716/4  |
| 6,523,159 | B2 | * | 2/2003  | Bernstein et al. ............. 716/10 |
| 6,532,439 | B2 | * | 3/2003  | Anderson et al. ............. 703/14  |
| 6,571,184 | B2 | * | 5/2003  | Anderson et al. ............. 702/65  |
| 6,618,843 | B2 | * | 9/2003  | Dansky et al. ................. 716/5  |
| 6,618,845 | B2 | * | 9/2003  | Thorp et al. .................... 716/5  |
| 6,763,509 | B2 | * | 7/2004  | Korobkov ....................... 716/8  |
| 6,807,656 | B1 | * | 10/2004 | Cao et al. ....................... 716/4  |
| 6,898,769 | B2 | * | 5/2005  | Nassif et al. .................. 716/5  |
| 6,937,971 | B1 | * | 8/2005  | Smith et al. ................... 703/18 |
| 2002/0095647 | A1 | * | 7/2002  | Bernstein et al. ............. 716/10 |
| 2004/0226735 | A1 | * | 11/2004 | Wu et al. ................... 174/52.1 |
| 2004/0230926 | A1 | * | 11/2004 | Berry et al. .................... 716/5 |
| 2004/0250229 | A1 | * | 12/2004 | Tran ............................. 716/10 |
| 2006/0075369 | A1 | * | 4/2006  | Dillon et al. ................. 716/10 |
| 2006/0123376 | A1 | * | 6/2006  | Vogel et al. .................. 716/11 |
| 2006/0190895 | A1 | * | 8/2006  | Ishikawa ..................... 716/10 |

FOREIGN PATENT DOCUMENTS

JP   2002-288253   10/2002
JP   2003-256489    9/2003

OTHER PUBLICATIONS

Su, H., Optimal Decoupling Capacitor Sizing and Placement for Standard Cell Layout Designs, IBM.*
Wang, J., Standard cell design with resolution-enhancement-technique-driven reularly placed contacts and gates, Mar. 16, 2005, SPIE Digital Library, Jan.-Mar. 2005, vol. 4 Issue 1, 013001.*

* cited by examiner

*Primary Examiner*—Jack Chiang
*Assistant Examiner*—Patrick Sandoval
(74) *Attorney, Agent, or Firm*—Staas & Halsey LLP

(57) ABSTRACT

A layout method of decoupling capacitors while ensuring the decoupling capacitance necessary for each grid area. The method includes calculating the total power consumption of logic cells, arranging the decoupling capacitance throughout the subject area in correspondence with the total power consumption, dividing the subject area into a plurality of grid areas, arranging the logic cells in each grid area, determining whether the decoupling capacitance is sufficient in each grid area for the logic cells in that grid area, and performing a supplementing process of the decoupling capacitance based on whether the decoupling capacitance is sufficient.

13 Claims, 8 Drawing Sheets

LAYOUT METHOD OF DECOUPLING CAPACITORS

CROSS-REFERENCE TO RELATED APPLICATIONS

This application is based upon and claims the benefit of priority from prior Japanese Patent Application No. 2004-214759, filed on Jul. 22, 2004, the entire contents of which are incorporated herein by reference.

BACKGROUND OF THE INVENTION

The present invention relates to a method for designing a semiconductor device provided with decoupling capacitors, and more particularly, to a layout method of decoupling capacitors.

In recent years, semiconductor devices have become faster and larger thereby increasing power consumption. The increase in power consumption may cause power supply noise that would interfere with stable operation of the semiconductor device. Therefore, decoupling capacitors are provided between a high voltage power supply line and a low voltage power supply line in the semiconductor device. For a semiconductor device including such decoupling capacitors, it is required that the decoupling capacitors be efficiently laid out to reduce the number of design processes.

In a process for designing a semiconductor device in the prior art, FIG. 1 shows the procedure for determining the layout of logic cells. Each logic cell is a cell unit including a plurality of logic circuits. The decoupling capacitor suppresses power supply noise that is generated when the logic cells are activated.

First, in step S1, the logic cells are laid out. In step S2, wires are routed to connect the logic cells to one another. Before the layout of the logic cells, wires connecting functional blocks, such as an analog signal circuit block or a CPU core, are laid out. In each functional block, the decoupling capacitor is laid out beforehand.

After locating the logic cells, in step S3, the decoupling capacitors are laid out in the areas that are unoccupied. In step S4, the areas in which the logical cells are laid out are equally divided to define grid areas. Then, the power consumption of the logic cell in each grid area is calculated.

In step S5, the decoupling capacitance that is necessary for each grid area is calculated. Then, in step S6, the decoupling capacitance of the decoupling capacitors laid out in step S3 is compared with the capacitance calculated in step S5 for each grid area to determine whether the decoupling capacitance necessary for the power consumption is allocated to each grid area.

When the necessary decoupling capacitance is allocated in every one of the grid areas, the layout of the logic cells and the decoupling capacitors is completed. If there is a grid area to which the necessary decoupling capacitance is not allocated, the logic cells are re-laid out (step S7). Then, steps S2 to S6 are repeated.

Japanese Laid-Out Patent Publication No. 2003-256489 describes a first prior art method including a step for laying out functional blocks and input/output blocks and a subsequent step for laying out unit cell capacitor blocks that serve as decoupling capacitors in unoccupied areas.

Japanese Laid-Out Patent Publication No. 2002-288253 describes a second prior art method including a step for dividing a chip into a plurality of grids, a step for determining whether the decoupling capacitance necessary for the power consumption is allocated in each grid, and a step for increasing a macro-area when the decoupling capacitance is insufficient.

SUMMARY OF THE INVENTION

In step S6 of FIG. 1, when there is a grid area that does not have the necessary decoupling capacitance, steps S2 to S7 are repeated to move the logic cells and relocate the decoupling capacitors. Accordingly, a long period of time is required to allocate the decoupling capacitance. This increases the manufacturing cost of a semiconductor device provided with decoupling capacitors. The same problem occurs in the second prior art method.

In the first prior art method, the layout of functional blocks and input/output blocks is repeated when the necessary decoupling capacitance is not ensured for the entire chip. However, there is no disclosure of a method for ensuring the necessary decoupling capacitance for each grid area. Therefore, the first prior art method cannot guarantee suppression of power supply noise.

One aspect of the present invention is a layout method of decoupling capacitors in a subject area where a plurality of logic cells are to be laid out. The method includes calculating the total power consumption of the logic cells, arranging the decoupling capacitors throughout the subject area in correspondence with the total power consumption, dividing the subject area into a plurality of grid areas, arranging the logic cells in each grid area, determining whether the decoupling capacitors are sufficient in each grid area for the logic cells in that grid area, and supplementing decoupling capacitance based on the result of said determining.

Another aspect of the present invention is a layout method of decoupling capacitors in a subject area where a plurality of logic cells are to be laid out. The method includes calculating the total power consumption of the logic cells, and arranging a plurality of rows of unit cell capacitors in the subject area. Each unit cell capacitor has a unit decoupling capacitance. The total decoupling capacitance of the unit cell capacitors is in correspondence with the total power consumption. The rows of unit cell capacitors are separated from each other by an equal pitch. The method further includes dividing the subject area into a plurality of grid areas, arranging the logic cells in each grid area, determining whether the decoupling capacitance of each grid area is sufficient for the logic cells in that grid area, and supplementing decoupling capacitance based on the result of said determining whether the decoupling capacitance of each grid area is sufficient.

A further aspect of the present invention is a method for designing a semiconductor device including a plurality of logic cells. The method includes calculating the total power consumption of the logic cells, calculating a decoupling capacitance corresponding to the total power consumption, and providing a plurality of unit cell capacitors. Each unit cell capacitor has a decoupling capacitance. The method further includes defining a subject area, arranging a plurality of unit cell capacitors in the subject area, dividing the subject area into a plurality of grid areas, arranging the logic cells in the grid areas, determining whether the decoupling capacitance of each grid area is sufficient for the logic cells in the grid area, and adjusting the decoupling capacitance of each grid area when the decoupling capacitance of the grid area is insufficient for the logic cells in the grid area.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A method for designing a semiconductor device according to a first embodiment of the present invention will now be described with reference to the drawings. The first embodiment includes a method for optimally arranging decoupling capacitors in a subject area in which a plurality of logic cells are to be laid out. Apart from the logic cells, functional blocks have their own decoupling capacitors. Thus, in the first embodiment, the areas in which the functional blocks are arranged are not taken into consideration.

Figure 1:
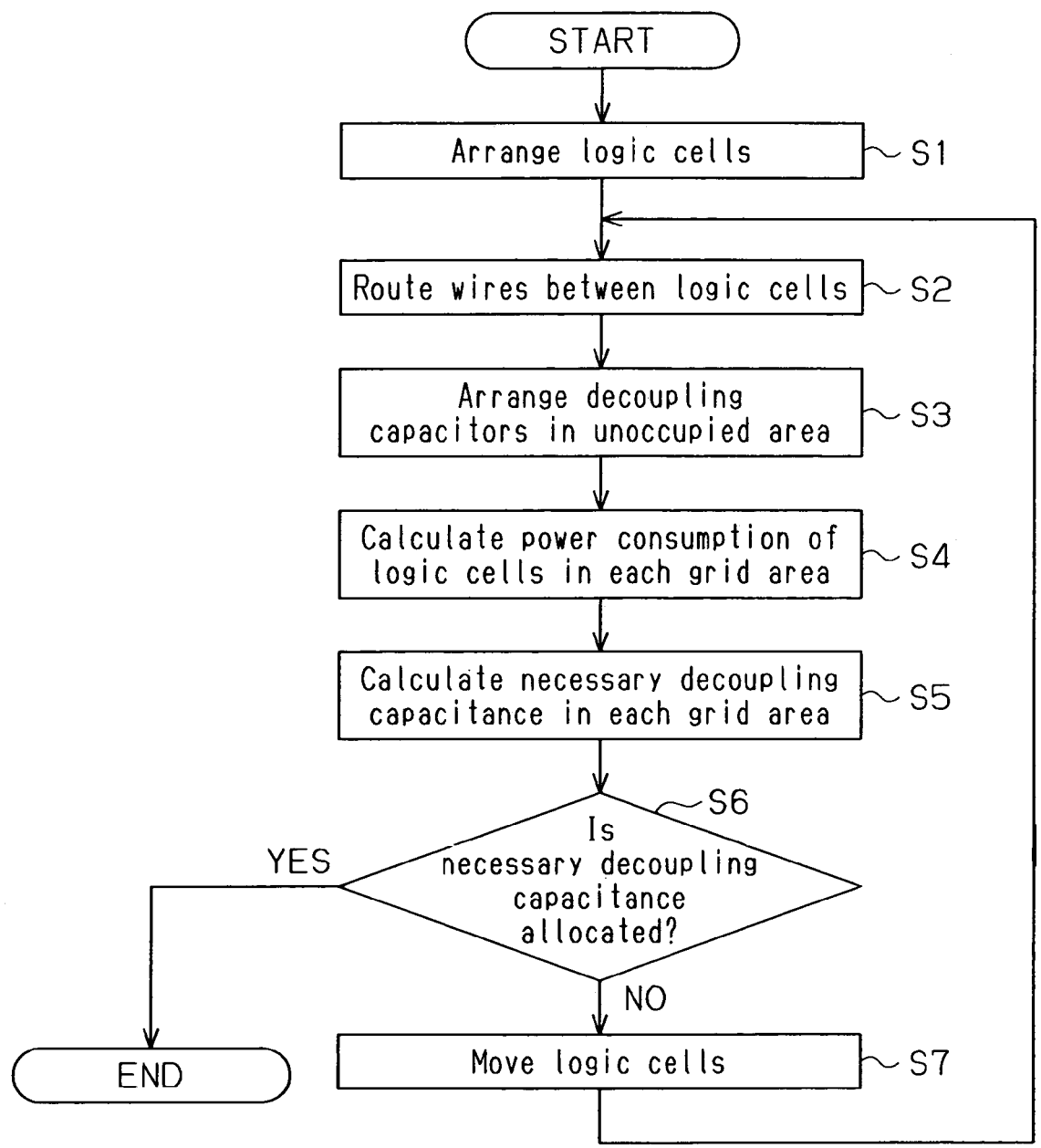
FIG. 1 is a flowchart showing a procedure for arranging decoupling capacitors in the prior art.
Figure 2:
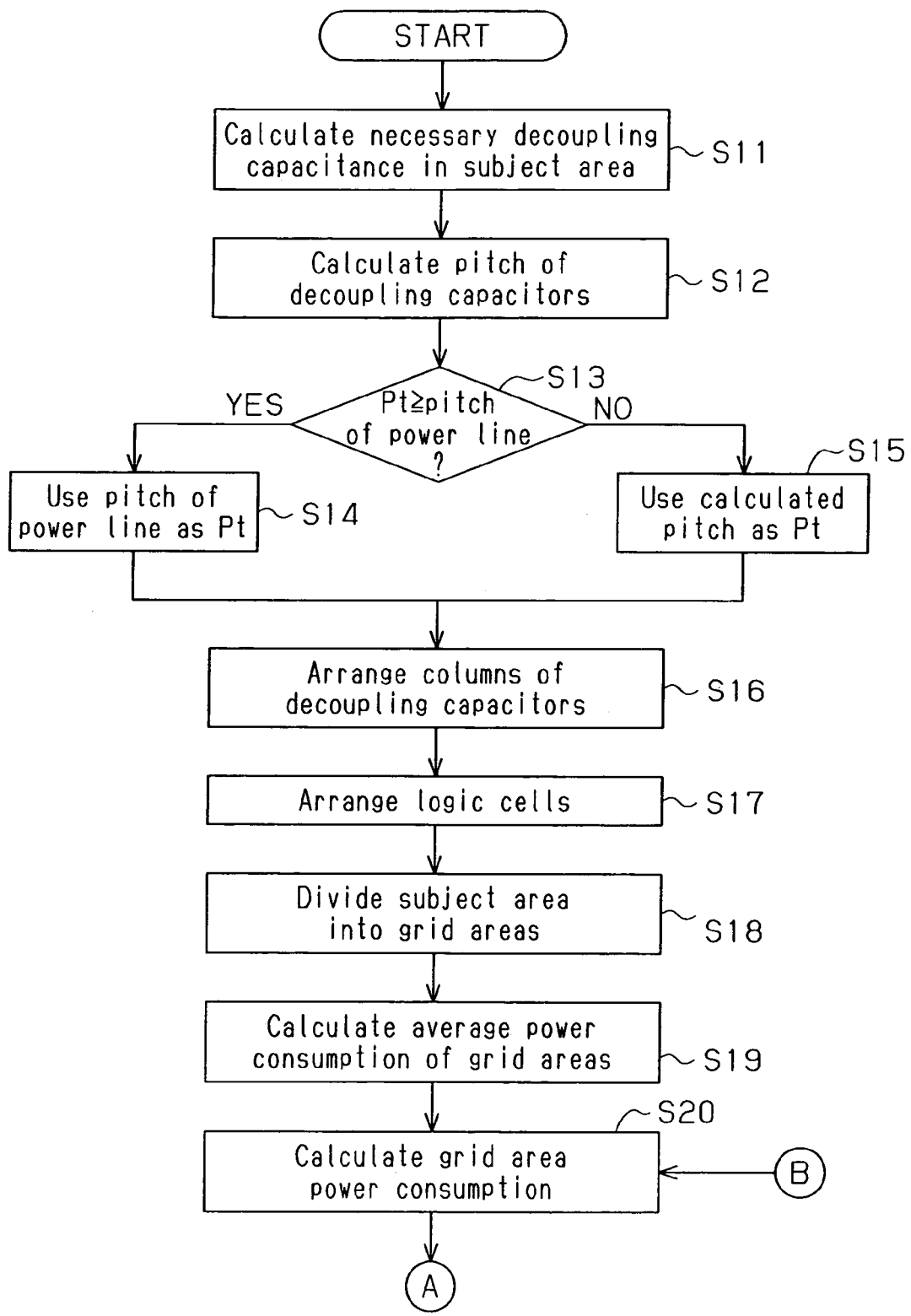
FIGS. 2 and 3 are flowcharts showing a procedure for arranging decoupling capacitors according to a first embodiment of the present invention.
Figure 3:
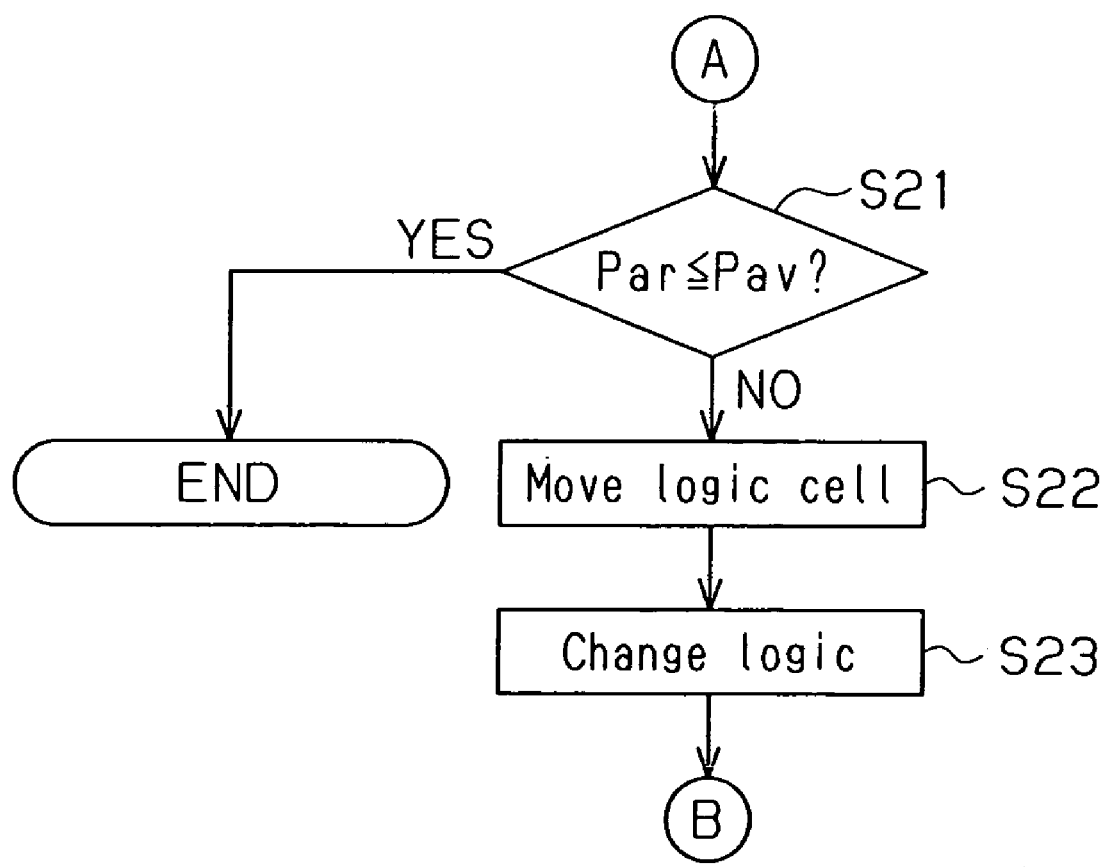

FIGS. 2 and 3 show a layout method of decoupling capacitors in the first embodiment.

First, based on the power consumption of the entire subject area in which logic cells are laid out, the decoupling capacitance necessary in the subject area is calculated (step S11).

The power consumption of the subject area is calculated based on a net list of the logic cells laid out in the subject area and the operating conditions of each logic cell. As the power consumption of the subject area increases, the load on the power supply increases. As a result, power supply noise is apt to being produced. Accordingly, the decoupling capacitance allocated to the subject area must be increased.

The total decoupling capacitance Cd required in the subject area is calculated from the next equation.

$$Cd = P/(f \cdot V_{DD} \cdot \Delta V) - Cp \quad \text{equation 1}$$

Figure 8:
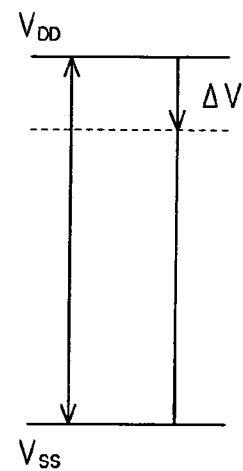
FIG. 8 is an explanatory diagram showing the tolerated drop amount of the power supply voltage.

In the equation 1, P represents the total power consumption in the subject area, f represents the operational frequency, VDD represents the power supply voltage shown in FIG. 8, $\Delta V$ represents the tolerable potential drop amount of the power supply voltage VDD, Cp represents the parasitic capacitance that is produced between power supplies and can be assumed to be the decoupling capacitance.

Figure 4:
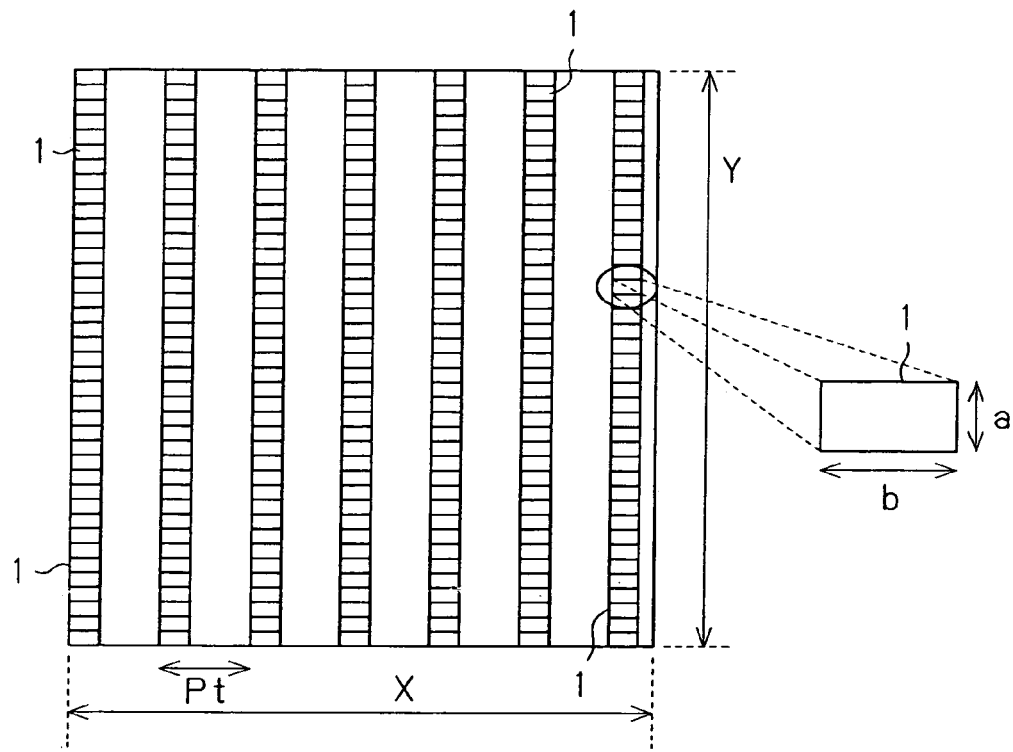
FIG. 4 is schematic diagram showing a subject area in which decoupling capacitors are laid out.

Following the calculation of the total decoupling capacitance Cd, the pitch (interval) for arranging decoupling capacitors in columns in the subject area is calculated (step S12). Referring to FIG. 4, in the calculation, the width is represented by X and the length is represented by Y for the subject area in which the logic cells are arranged. The length is represented by a and the width is represented by b in for a unit cell capacitor 1, which configures a decoupling capacitor.

When Cd represents the total decoupling capacitors necessary for the subject area and Co represents the capacitance in each unit cell capacitor, the total number of unit cell capacitors 1 is expressed by Cd/Co.

The number of unit cell capacitors 1 arranged in the longitudinal direction is expressed by Y/a. Thus, an Y/a number of cell capacitance units 1 can be arranged in the Y direction of the subject area. Further, the number of columns of the unit cell capacitors 1 arranged in the X direction of the subject area is expressed by (Cd/Co)÷(Y/a).

Accordingly, the pitch Pt of columns of the unit cell capacitors 1 in the subject area is obtained from equation 2.

$$Pt = \frac{x \cdot y}{a} \cdot \frac{Co}{Cd} \quad \text{equation 2}$$

Then, it is determined whether the calculated pitch Pt is greater than the pitch of power supply lines (step S13). The power supply lines are formed in a layer above the layer in which the logic cells and the decoupling capacitors are formed and the pitch of the power supply lines is predetermined.

When the calculated pitch Pt is greater than or equal to the pitch of the power supply lines, the pitch of the power supply lines is used as the pitch of the decoupling capacitors (step S14). When the calculated pitch Pt is less than the pitch of the power supply lines, the pitch Pt is used as the pitch of the decoupling capacitors (step S15).

As shown in FIG. 4, the unit cell capacitors 1 are then arranged in columns at pitch Pt to constitute decoupling capacitors (step S16).

Logic cells are then laid out in areas in which the decoupling capacitors are not arranged (step S17). Thus, a concentrated placement of the logic cells is avoided.

Figure 5:
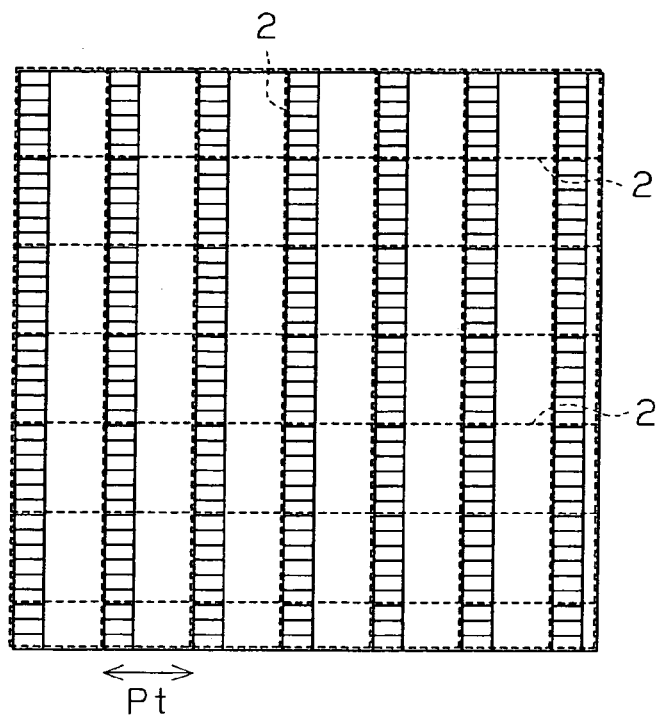
FIG. 5 is a schematic diagram showing a plurality of grid areas defined in the subject area.

Then, referring to FIG. 5, the subject area is divided into a plurality of grid areas 2 (step S18). The grid areas 2, for example, are squares formed by dividing the subject area in the X and Y directions by the pitch Pt. Thus, length of each side of each grid area 2 is equal to the pitch Pt. As long as the decoupling capacitors are evenly arranged in the grid areas 2, the subject area may be divided at any pitch and each grid area 2 does not have to be shaped as a square.

Subsequently, the average power consumption of the grid areas 2 is calculated based on the total power consumption P of the subject area (step S19). The average power consumption Pav is obtained by dividing the total power consumption P by the number of grid areas 2.

The grid area power consumption Par, which is the power consumption of the logic cells laid out in each grid area 2, is then calculated (step S20). Further, it is determined whether the grid area power consumption Par is less than or equal to the average power consumption Pav (step S21).

Figure 6:
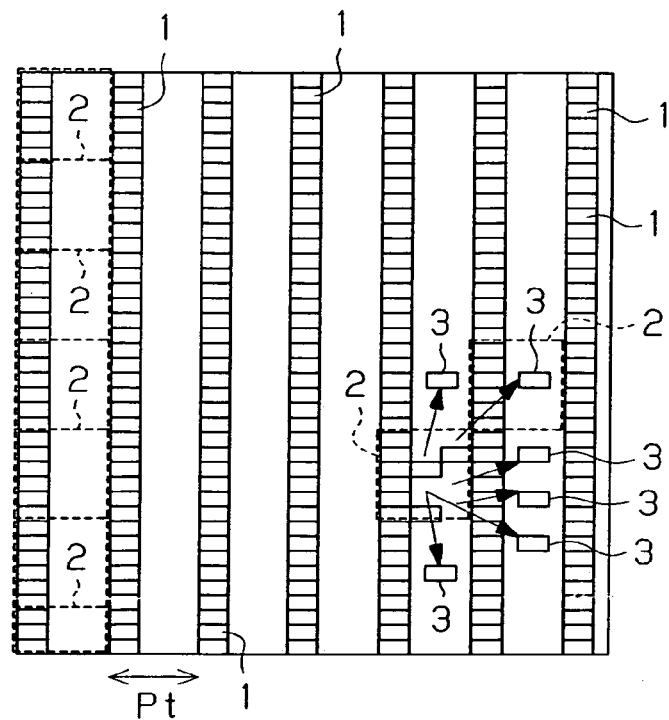
FIG. 6 is a schematic diagram showing the movement of logic cells.

When the grid area power consumption Par exceeds the average power consumption Pav, the decoupling capacitance allocated to that grid area 2 is insufficient. Thus, as shown in FIG. 6, the logic cells 3 laid out in that grid area 2 is moved to another grid area 2 (step S22).

Further, the logic of the logic circuit is changed to reduce the power consumption of the logic cells laid out in that grid area 2 (step S23). Then, the processing returns to step S20.

Figure 9A:
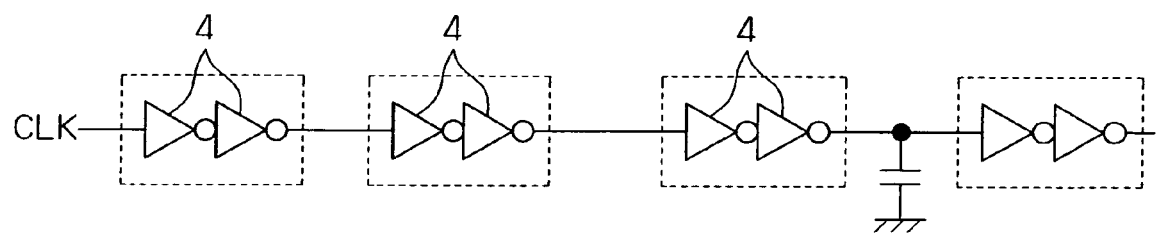
FIGS. 9A and 9B are circuit diagrams showing logic cells.
Figure 9B:
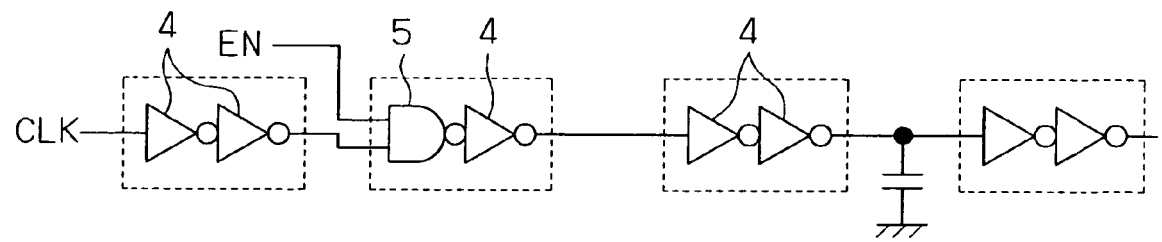

An example for changing logics will now be described with reference to FIGS. 9A and 9B. FIG. 9A shows a logic circuit prior to a change in the logic. FIG. 9B shows the logic circuit subsequent to the change in the logic. A plurality of inverter circuits 4 are series-connected in the logic circuit of FIG. 9A. When a clock signal CLK is input, the clock signal CLK is inverted by each inverter circuit 4. Thus, power is constantly consumed in each inverter circuit 4.

In the logic circuit of FIG. 9B, an enable signal EN is input to a NAND circuit 5, which is located between inverter circuits 4. When the input enable signal EN is low, inversion of the output signal is stopped in the stages following the NAND circuit 5. This reduces power consumption.

Accordingly, the enable signal EN goes high only when the clock signal CLK must be transferred. This reduces the power consumption in comparison with the logic circuit shown in FIG. 9A.

Steps S21 to S23 are repeated for every one of the grid areas 2. In each grid area 2, when the grid area power consumption Par is less than or equal to the average power consumption Pav, the decoupling capacitance allocated to the grid area 2 is sufficient with respect to the grid area power consumption Par, and the layout of the logic cells and decoupling capacitors is thus completed.

Figure 10:
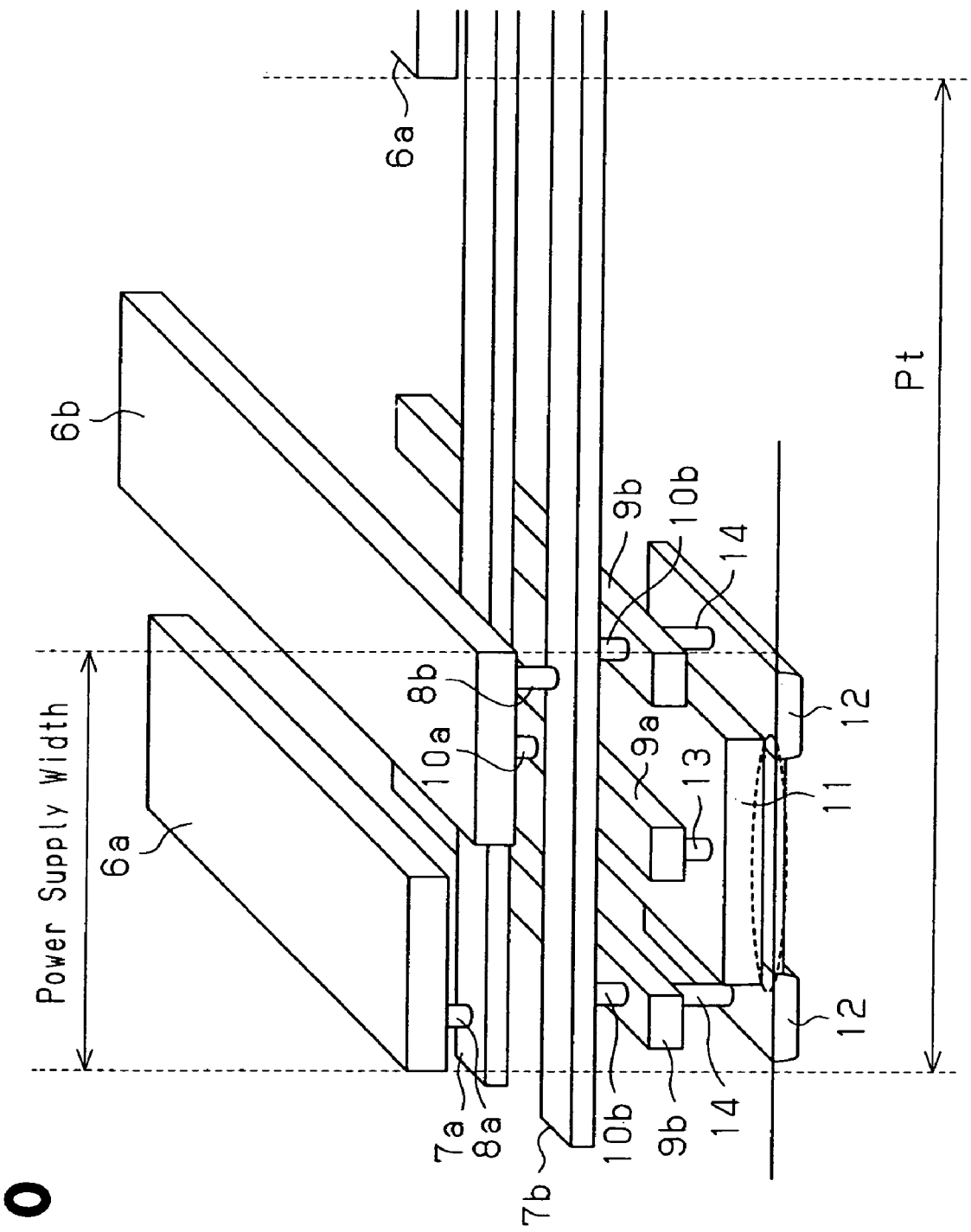
FIG. 10 is a schematic diagram showing a decoupling capacitor under a layer of power supply lines.

FIG. 10 shows the configuration of decoupling capacitors in a layer under the power supply lines. High voltage power supply lines 6a and low voltage power supply lines 6b are formed in a third wiring layer. High voltage power supply lines 7a and low voltage power supply lines 7b are formed in a second wiring layer. The high voltage power supply lines 6a and the low voltage power supply lines 6b are connected to the high voltage power supply lines 7a and the low voltage power supply lines 7b by contact vias 8a and 8b, respectively.

High voltage power supply lines 9a and low voltage power supply lines 9b are formed in a first wiring layer. The high voltage power supply lines 7a and the low voltage power supply lines 7b are connected to the high voltage power supply lines 9a and the low voltage power supply lines 9b by contact vias 10a and 10b, respectively.

A decoupling capacitor is formed in a layer under the first layer of the high and low voltage power supply lines 9a and 9b. The decoupling capacitor, which has the same configuration as an n-channel MOS transistor. N-type diffusion layers 12 are formed on opposite sides of a gate wire 11. The gate wire 11 is connected to the high voltage power supply line 9a by a contact via 13. The N-type diffusion layers 12 are connected to the low voltage power supply lines 9b by contact vias 14.

In such a configuration, a channel is formed in a layer under the gate wire 11 based on the supply of a high voltage power supply VDD and a low voltage power supply VSS. A decoupling capacitor is configured by the channel and the gate wire 11.

The first embodiment has the advantages described below.

(1) Before arranging the logic cells, the decoupling capacitors are evenly arranged in the subject area. The logic cells are then laid out in the unoccupied area in which decoupling capacitors are not arranged. This decreases the difference between the decoupling capacitance necessary for the power consumption of the logic cells laid out in the grid area and the decoupling capacitance allocated beforehand in the grid area. As a result, the decoupling capacitors are efficiently arranged while ensuring the necessary decoupling capacitance in each grid area. Further, this reduces work that would be required to have the decoupling capacitance correspond appropriately to the power consumption of each grid area.

(2) The decoupling capacitance necessary for the total power consumption of the logic cells is calculated and the decoupling capacitors having the calculated decoupling capacitance are arranged in columns at a predetermined pitch in the subject area. Accordingly, the decoupling capacitors are equally arranging the grid areas while allocating the necessary decoupling capacitance in the subject area.

(3) The average power consumption of each grid area is calculated from the total power consumption of the logic cells laid out in the subject area. By comparing the average power consumption with the power consumption of the logic cells laid out in each grid area, it can be determined whether the decoupling capacitance is efficient in each grid area.

(4) When the decoupling capacitance is insufficient in a grid area, logic cells are moved into that grid area from other grid areas. This easily fulfills the decoupling capacitance in each grid area.

(5) When the decoupling capacitance is insufficient in a grid area, the logic is changed to reduce the power consumption of the logic cells in that grid area. This easily fulfills the decoupling capacitance in each grid area.

(6) The decoupling capacitance in each grid area is fulfilled by moving the logic cells or by changing logics without having to rearrange the decoupling capacitors. Thus, the layout of the decoupling capacitors can be completed within a short period of time.

(7) The layout of decoupling capacitors in a layer under the power supply lines is enabled by using the pitch of the power supply lines as the pitch Pt of the decoupling capacitors. Since the decoupling capacitors are laid out near the power supply lines, the effect for reducing power supply noise with the decoupling capacitance is improved. Further, the decoupling capacitors can be arranged in a layer under the power supply lines where the logic cells cannot be arranged.

Figure 11:
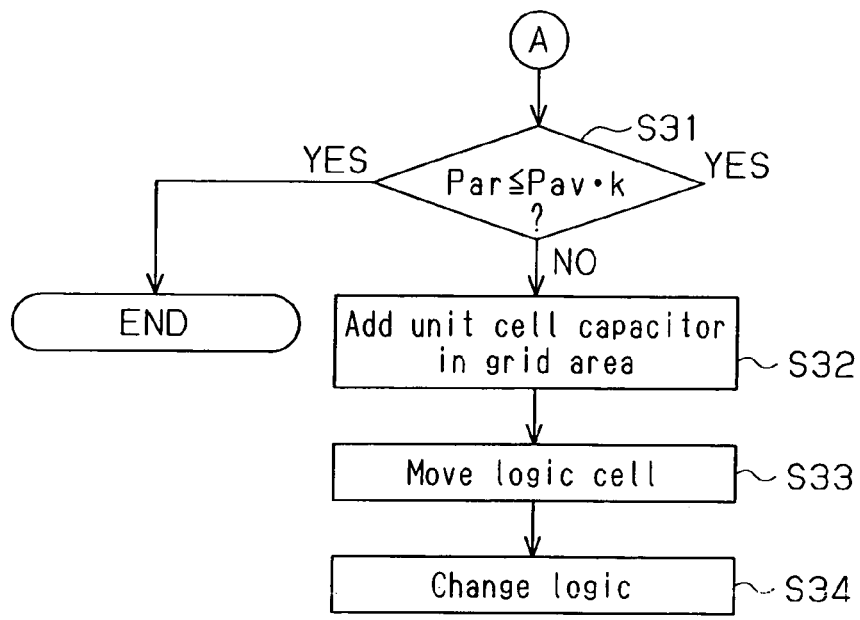
FIG. 11 is a flowchart showing a procedure for arranging decoupling capacitors according to a second embodiment of the present invention.

A second embodiment of the present invention will now be discussed with reference to FIG. 11. In the second embodiment, steps S31 to S33 are executed subsequent to steps S1 to S20 of the first embodiment.

In step S31, which follows step S20, it is determined whether the unit area power consumption Par is less than or equal to a value obtained by multiplying the average power consumption Pav by coefficient k (k>1) in each grid area 2.

Figure 7:
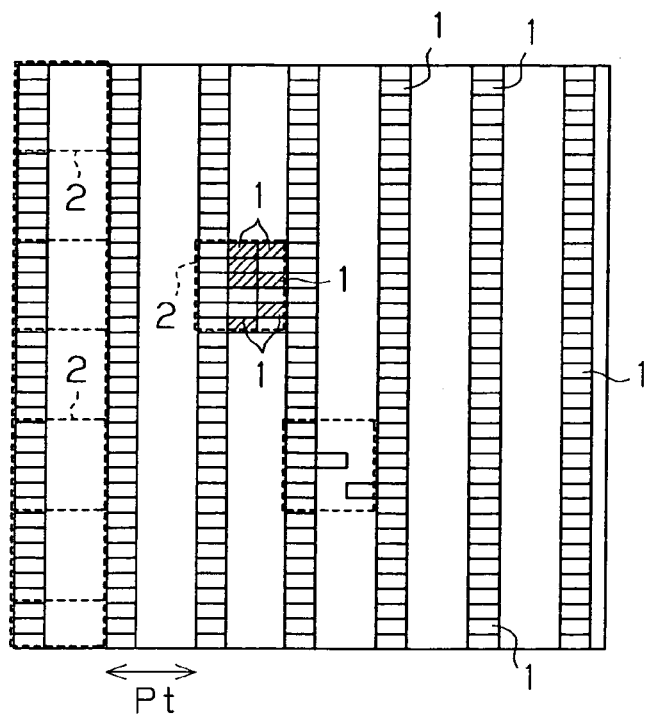
FIG. 7 is a schematic diagram showing the addition of unit cell capacitors.

When the unit area power consumption Par exceeds the average power consumption Pav·k, a unit cell capacitor 1 is added in the grid area 2, as shown in FIG. 7 (step S32).

Then, the logic cells 3 laid out in the grid area 2 are moved to another grid area 2 (step S33) and the logic of the logic circuit is changed (step S34) as required. The process then returns to step S20.

Steps S33 and S34 are respectively identical to steps S22 and S23 of the first embodiment.

In addition to the advantages of the first embodiment, the second embodiment has the advantages described below.

(1) A value obtained by multiplying the average power consumption Pav by the coefficient k is compared with the grid area power consumption Par. Thus, the comparison result has a sufficient margin.

(2) When the grid area power consumption Par exceeds the average power consumption Pav-k, unit cell capacitors 1 are added to that grid area 2. This increases the options for supplementing the decoupling capacitance in each grid area 2.

A third embodiment according to the present invention will now be discussed with reference to FIG. 12. In the third embodiment, the calculation of the average power consumption of the grid areas is not performed. Further, it is determined whether the decoupling capacitance is sufficient based on the comparison between the necessary decoupling capacitance for each unit area and the decoupling capacitance allocated to each grid area.

Figure 12:
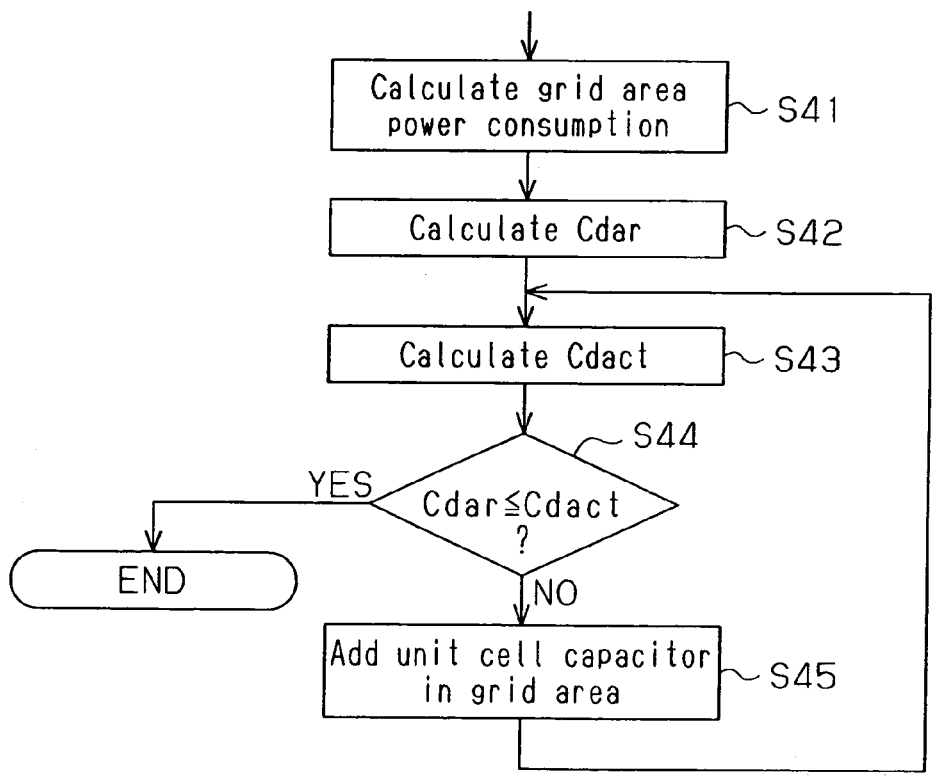
FIG. 12 is a flowchart showing a procedure for arranging decoupling capacitors according to a third embodiment of the present invention.

FIG. 12 shows the processes performed after step S18 of the first embodiment. In step S18, the subject area is divided into a plurality of grid areas 2. Then, the grid area power consumption Par of each grid area 2 is calculated (step S41).

Subsequently, the decoupling capacitance Cdar necessary in each grid area 2 is calculated (step S42). The decoupling capacitance Cdar is calculated from the next equation based on the total decoupling capacitance Cd necessary in the subject area, the total power consumption P, and the grid area power consumption Par.

$$Cdar = Cd \cdot \frac{Par}{P} \quad \text{equation 3}$$

Then, the decoupling capacitance Cdact allocated in each grid area 2 is calculated (step S43). The decoupling capacitor Cdact is obtained by dividing the total decoupling capacitance Cd by the number of grid areas 2.

Further, it is determined whether the decoupling capacitance Cdar is less than or equal to the decoupling capacitance Cdact (step S44). When the decoupling capacitance Cdar is greater than the decoupling capacitance Cdact, the decoupling capacitance is insufficient in that grid area 2. Thus, unit cell capacitors 1 are added to that grid area 2 (step S45). Then, the process returns to step S43.

Steps S43 to S45 are repeated for every one of the grid areas 2. When the decoupling capacitance Cdar necessary for each grid area 2 is less than the allocated decoupling capacitance Cdact, the decoupling capacitance allocated in each grid area 2 is sufficient. Thus, the layout of the logic cells and the decoupling capacitance is completed.

Instead of adding the unit cell capacitors 1 in step S45, steps S22 and S23 of FIG. 3 may be performed. That is, the logic cells may be moved or the logic may be changed.

Further, the decoupling capacitance Cdar necessary in each grid area 2 may be calculated from the quantity or area ratio of clock buffers, which consume much power.

For example, when the cell quantity of clock buffers in the subject area is represented by N and the cell quantity of clock buffers in a unit area is represented by Nar, the decoupling capacitance Cdar necessary for each grid area 2 is calculated from the next equation.

$$Cdar = Cd \cdot \frac{Nar}{N} \quad \text{equation 4}$$

Instead of the clock buffers, the same calculation may be performed based on the quantity of flip-flops operated synchronously with a clock signal.

Accordingly, by comparing the necessary decoupling capacitance Cdar in each grid area 2 with the decoupling capacitance Cdact allocated to each grid area 2, it may be determined whether the decoupling capacitance is sufficient in each grid area.

It should be apparent to those skilled in the art that the present invention may be embodied in many other specific forms without departing from the spirit or scope of the invention. Particularly, it should be understood that the present invention may be embodied in the following forms.

The columns of decoupling capacitors may be arranged in the subject area in the Y direction or any other direction.

In the first embodiment, the supplementing process of decoupling capacitance may be performed by moving the logic cells or changing logics.

In the second embodiment, the process for supplementing the decoupling capacitance may be performed by adding unit cell capacitors, moving logic cells, or by changing logics.

The present examples and embodiments are to be considered as illustrative and not restrictive, and the invention is not to be limited to the details given herein, but may be modified within the scope and equivalence of the appended claims.

What is claimed is:

1. A layout method of decoupling capacitors in a subject area where a plurality of logic cells are to be laid out, the method comprising:

calculating a total power consumption of the logic cells to be laid out in the subject area;

calculating an equal pitch for arranging decoupling capacitors in columns in the subject area based on the calculated total power consumption of the logic cells;

arranging the decoupling capacitors throughout the subject area in columns with the calculated equal pitch;

dividing the subject area into a plurality of grid areas;

arranging the logic cells in each grid area;

determining whether the decoupling capacitors are sufficient in each grid area for the logic cells in that grid area; and supplementing decoupling capacitance based on the result of said determining, wherein said calculating of an equal pitch is performed prior to said arranging of the decoupling capacitors and the logic cells.

2. The method according to claim 1, wherein said supplementing decoupling capacitance includes at least one of:

moving a logic cell in one grid area where the decoupling capacitance is insufficient to another grid area;

changing logic of the logic cells; and adding unit cell capacitors in a grid area where the decoupling capacitance is insufficient.

3. A layout method of decoupling capacitors in a subject area where a plurality of logic cells are to be laid out, the method comprising:

calculating the total power consumption of the logic cells to be laid out in the subject area;

calculating an equal pitch for arranging unit cell capacitors in columns in the subject area based on the calculated total power consumption of the logic cells;

arranging a plurality of columns of unit cell capacitors in the subject area with the calculated equal pitch, each unit cell capacitor having a decoupling capacitance, wherein the total decoupling capacitance of the unit cell capacitors is in correspondence with the calculated total power consumption, and the columns of unit cell capacitors are separated from each other by the calculated equal pitch;
dividing the subject area into a plurality of grid areas;
arranging the logic cells in each grid area;
determining whether the decoupling capacitance of each grid area is sufficient for the logic cells in that grid area; and
supplementing decoupling capacitance based on the result of said determining whether the decoupling capacitance of each grid area is sufficient,
wherein
said calculating of an equal pitch is performed prior to said arranging of a plurality of columns of unit cell capacitors and the logic cells.

4. The method according to claim 3, wherein said arranging a plurality of columns of unit cell capacitors includes calculating the dimension of the subject area and calculating the pitch based on the dimension of each unit cell capacitor.

5. The method according to claim 4, wherein the subject area includes a layer including a plurality of power supply lines separated from each other by a predetermined pitch, wherein said arranging a plurality of columns of unit cell capacitors includes arranging the unit cell capacitors when the equal pitch of the rows of unit cell capacitors is greater than or equal to the predetermined pitch of the power supply lines.

6. The method according to claim 3, wherein said determining whether the decoupling capacitance of each grid area is sufficient includes:
calculating the average power consumption based on the total power consumption and the quantity of the grid areas; and
comparing the average power consumption and the power consumption of the logic cells arranged in the grid area.

7. The method according to claim 3, wherein said determining whether the decoupling capacitance of each grid area is sufficient includes:
comparing the decoupling capacitance necessary in each grid area and the decoupling capacitance of the unit cell capacitors arranged in the grid area.

8. The method according to claim 7, wherein said determining whether the decoupling capacitance of each grid area is sufficient includes:
calculating the decoupling capacitance necessary in each grid area based on the ratio of the quantity of logic cells activated synchronously with a clock signal in the subject area relative to the quantity of logic cells activated synchronously with the clock signal in each grid area.

9. The method according to claim 3, wherein said supplementing decoupling capacitance includes at least one of:
moving a logic cell in one grid area where the decoupling capacitance is insufficient to another grid area;
changing logic of the logic cells; and
adding unit cell capacitors in a grid area where the decoupling capacitance is insufficient.

10. A method for designing a semiconductor device including a plurality of logic cells, the method comprising:
calculating the total power consumption of the logic cells to be laid out in a subject area;
calculating a decoupling capacitance corresponding to the calculated total power consumption of the logic cells;
providing a plurality of unit cell capacitors, each unit cell capacitor having a unit decoupling capacitance and the total of the decoupling capacitance of the plurality of unit cell capacitors being equal to the calculated decoupling capacitance;
calculating an equal pitch for arranging unit cell capacitors in columns in the subject area based on the calculated total power consumption of the logic cells;
arranging the unit cell capacitors with the calculated equal pitch in the subject area;
dividing the subject area into a plurality of grid areas;
arranging the logic cells in the grid areas;
determining whether the decoupling capacitance of each grid area is sufficient for the logic cells in the grid area; and
adjusting the decoupling capacitance of each grid area when the decoupling capacitance of the unit cell capacitors arranged in the grid area is insufficient for the logic cells in the grid area,
wherein
said calculating of an equal pitch is performed prior to said arranging of a plurality of unit cell capacitors and the logic cells.

11. The method according to claim 10, wherein said arranging a plurality of unit cell capacitors include arranging a plurality of parallel columns of the unit cell capacitors at the calculated equal pitch in the subject area.

12. The method according to claim 11, wherein each grid area is square, and the grid areas form columns of the grid areas including a first column configured by first ones of the grid areas and a second column configured by second ones of the grid areas, the columns of the unit cell capacitors being arranged in correspondence with the columns of the grid areas, respectively.

13. The method according to claim 10, wherein said adjusting the decoupling capacitance includes at least one of:
moving a logic cell in one grid area where the decoupling capacitance is insufficient to another grid area;
changing logic of the logic cells; and
adding unit cell capacitors in a grid area where the decoupling capacitance is insufficient.

* * * * *